US012755793B2

(12) United States Patent
Liang et al.

(10) Patent No.: US 12,755,793 B2
(45) Date of Patent: Oct. 6, 2026

(54) MEMORY ARRAY AND METHODS OF OPERATION

(71) Applicant: Microchip Technology Incorporated, Chandler, AZ (US)

(72) Inventors: Hsuan Liang, Zhudong Township (TW); Steve Nagel, Chandler, AZ (US); Chu-Kuang Tsai, New Taipei City (TW)

(73) Assignee: Microchip Technology Incorporated, Chandler, AZ (US)

( * ) Notice: Subject to any disclaimer, the term of this patent is extended or adjusted under 35 U.S.C. 154(b) by 172 days.

(21) Appl. No.: 18/937,319

(22) Filed: Nov. 5, 2024

(65) Prior Publication Data

US 2026/0088095 A1 Mar. 26, 2026

Related U.S. Application Data

(60) Provisional application No. 63/698,098, filed on Sep. 24, 2024.

(51) Int. Cl.

*G11C 7/00* (2006.01)
*G11C 16/04* (2006.01)
*G11C 16/10* (2006.01)
*G11C 16/14* (2006.01)

(52) U.S. Cl.

CPC ........ *G11C 16/102* (2013.01); *G11C 16/0433* (2013.01); *G11C 16/14* (2013.01)

(58) Field of Classification Search

CPC .... G11C 16/102; G11C 16/0433; G11C 16/14
USPC .................................................. 365/189.011
See application file for complete search history.

(56) References Cited

U.S. PATENT DOCUMENTS 5,138,575 A * 8/1992 Ema .................... G11C 16/0433 365/233.5
5,363,330 A * 11/1994 Kobayashi ............. G11C 16/12 365/185.11
5,812,452 A * 9/1998 Hoang ............... G11C 16/0425 365/185.11
6,032,248 A * 2/2000 Curry ...................... G11C 16/08 712/E9.035
6,284,601 B1 * 9/2001 Hoang ............... G11C 16/0433 438/258
6,888,754 B2 * 5/2005 Chih ...................... G11C 16/16 365/185.11

(Continued)

OTHER PUBLICATIONS

International Search Report and Written Opinion, Application No. PCT/US2025/020629, 12 pages, Jun. 23, 2025.

*Primary Examiner* — Viet Q Nguyen
(74) *Attorney, Agent, or Firm* — SLAYDEN GRUBERT BEARD PLLC

(57) ABSTRACT

EEPPROM array having memory cells arranged in rows and columns, wherein the memory cells have a select transistor and a sense transistor; memory sections include a plurality of memory cells and a section select transistor; a source line physically coupled to a source terminal of a section select transistor; a wordline physically coupled to a gate of a section select transistor and a gate of a select transistor; and a sense gate line physically coupled to a gate of a sense transistor. An erase operation may be done by applying: a low voltage to the source line; a high voltage to the sense gate line; and a middle voltage to the wordline.

20 Claims, 6 Drawing Sheets

(56) References Cited

U.S. PATENT DOCUMENTS

| | | | | |
|---|---|---|---|---|
| 7,236,398 | B1 * | 6/2007 | Smolen | H10B 41/10 257/E27.103 |
| 7,304,890 | B2 * | 12/2007 | Lambrache | G11C 16/3427 365/185.11 |
| 7,649,786 | B2 * | 1/2010 | Conte | G11C 16/0433 365/185.12 |
| 8,139,408 | B2 * | 3/2012 | Georgescu | G11C 16/0458 365/185.01 |
| 8,327,212 | B2 * | 12/2012 | Ichimiya | G06F 11/1443 370/242 |
| 8,482,980 | B2 * | 7/2013 | Yuan | H10B 41/35 365/185.11 |
| 9,142,306 | B2 | 9/2015 | Wu et al. | |
| 9,286,982 | B2 * | 3/2016 | Tran | G11C 16/0425 |
| 9,595,335 | B2 | 3/2017 | Wu et al. | |
| 10,607,703 | B2 | 3/2020 | Liang et al. | |
| 11,315,636 | B2 | 4/2022 | Liang et al. | |
| 2005/0169052 | A1 | 8/2005 | Hsu et al. | 365/185.03 |
| 2014/0198571 | A1 | 7/2014 | Wu et al. | 365/185.05 |
| 2016/0005477 | A1 | 1/2016 | Wu et al. | 365/185.29 |

* cited by examiner

MEMORY ARRAY AND METHODS OF OPERATION

PRIORITY STATEMENT

This application claims priority to U.S. Provisional Patent Application No. 63/698,098 filed Sep. 24, 2024, the contents of which are hereby incorporated in their entirety.

TECHNICAL FIELD

The present disclosure relates to data memory structures and methods, in particular, to EEPROM that function with less area and less voltage to provide longer endurance.

BACKGROUND

A memory device generally includes memory cells arranged in an array, with memory cells in a row sharing the same wordline, while memory cells in a column share the same bitline. A memory cell may include a select transistor and a sense transistor. In a row, memory cells may be grouped into sections of memory cells. Each section may include eight memory cells, which make up a memory byte. Alternatively, each section may include twelve memory cells (comprising one and a half bytes), sixteen memory cells (comprising one word), thirty-two memory cells (comprising two words) or some other suitable number of memory cells.

In a conventional memory device, a section of memory may be controlled by a byte select transistor. For example, in an electrically erasable programmable read-only memory (EEPROM) device, each byte of memory can be associated with its own byte select transistor, which is connected to the memory cells that comprise the respective byte. A byte of memory, which is also referred to interchangeably as a memory byte or simply a byte, typically comprises eight memory cells, with each memory cell storing the value for a binary digit (bit). However, in some implementations, the memory section that is controlled by a byte select transistor may comprise a number of memory cells different from one byte. Conventional byte-selected transistors passes voltages greater than or equal to zero volts (≥0V), wherein a negative bias is not possible.

In some implementations, a memory device that implements an alternative mechanism to the byte select transistor may be realized by using separate source lines to select memory bytes to perform functions that are typically done by the byte select transistor, such as byte erase and write. The byte-select transistors are removed and the source lines are routed to enable selection, which introduces an inhibit VSP (>6V) for unselected bits during erase. Because there is no source selector, inhibit VSP will be applied to any unselected bits. Therefore, the byte select transistor may be removed from the memory device, leading to considerable savings of the device area. Further, this architecture may provide poor disturbance immunity.

Conventional memory devices typically operate with a high voltage of 16V at a select gate (wordline), a sense gate voltage (write) of 0V, and a bitline voltage (write) of 13.5V. A relatively larger charge pump supplies voltage up to the high voltage of 16V. Conventional memory devices typically endure for one million cycles.

There is a need for memory device architectures that function with less area and less voltage to provide longer endurance.

SUMMARY OF THE INVENTION

Aspects provide a method comprising: providing memory cells arranged in rows and columns, wherein respective ones of the memory cells have a select transistor and a sense transistor; providing memory sections, wherein respective ones of the memory sections includes a plurality of memory cells and a section select transistor; providing a source line physically coupled to a source terminal of a section select transistor; providing a wordline physically coupled to a gate of a section select transistor and a gate of a select transistor; and providing a sense gate line physically coupled to a gate of a sense transistor.

According to an aspect of the method of the preceding paragraph, there is a method, comprising erasing a memory cell of a memory section comprising: applying a low voltage to the source line; providing a bitline physically coupled to a drain of a select transistor and applying a low voltage to the bitline; applying a high voltage to the sense gate line; and applying an middle voltage to the wordline, wherein the high voltage is higher than the low voltage and the middle voltage is between the low voltage and the high voltage.

According to an aspect of the method of one of the preceding two paragraphs, there is a method, comprising: providing a bitline physically coupled to a drain of a select transistor.

According to an aspect of the method of one of the preceding three paragraphs, there is a method, comprising writing a memory cell of a memory section comprising: applying a float voltage to the source line; applying a high voltage to the wordline; applying a low voltage to the sense gate line; and applying an middle voltage to the bitline, wherein the high voltage is higher than the low voltage, the middle voltage is between the low voltage and the high voltage, and the float voltage is any voltage.

An aspect provides a device comprising: memory cells arranged in rows and columns, wherein respective ones of the memory cells have a select transistor and a sense transistor; memory sections, wherein respective ones of the memory sections includes a plurality of memory cells and a section select transistor; a source line physically coupled to a source terminal of a section select transistor; a wordline physically coupled to a gate of a section select transistor and a gate of a select transistor; and a sense gate line physically coupled to a gate of a sense transistor.

According to an aspect of the device of the preceding paragraph, there is a device, comprising respective ones of bitlines physically coupled to respective ones of drains of respective ones of select transistors, wherein for an erase operation of a first memory cell in a first memory section: a first source line is to apply a low voltage to a source terminal of a first section select transistor of the first memory section; a first bitline is to apply a low voltage to a drain of a first select gate transistor of the first memory cell; a first sense gate line is to apply a high voltage to a gate of a first sense transistor of the first memory cell; and a first wordline is to apply an middle voltage to a gate of the first section select transistor and a gate of a first select transistor of the first memory cell, wherein the high voltage is higher than the low voltage and the middle voltage is between the low voltage and the high voltage.

According to an aspect of the device of one of the preceding two paragraphs, there is a device, comprising a bitline physically coupled to a drain of a select transistor.

According to an aspect of the device of one of the preceding three paragraphs, there is a device, wherein for a write operation of a first memory cell in a first memory section: a first source line is to apply a float voltage to a source terminal of a first section select transistor of the first memory section; a first sense gate line is to apply a low voltage to a gate of a first sense transistor of the first memory cell; a first wordline is to apply a high voltage to a gate of the first section select transistor and a gate of a first select transistor of the first memory cell; and a first bitline is to apply an middle voltage to a drain of the first select transistor, wherein the high voltage is higher than the low voltage, the middle voltage is between the low voltage and the high voltage, and the float voltage is any voltage.

According to an aspect of the device of one of the preceding four paragraphs, there is a device, comprising: bitlines associated with groups of memory cells, respectively, wherein respective ones of the bitlines are physically coupled to respective ones of select transistors at drain terminals, wherein a first memory cell is associated with a first bitline that is distinct from other bitlines associated with other memory cells; source lines associated with groups of memory sections, respectively, wherein respective ones of the source lines are physically coupled to respective ones of section select transistors at source terminals, wherein memory sections included in a first group of memory sections are associated with a first source line that is distinct from other source lines associated with other groups of memory sections; wordlines associated with groups of memory sections, respectively, wherein respective ones of the wordlines are physically coupled to a gate of a section select transistor and a gate of a select transistor, wherein memory sections included in the first group of memory sections are associated with a first wordline that is distinct from other wordlines associated with other groups of memory sections; and sense gate lines associated with groups of memory sections, respectively, wherein respective ones of the sense gate lines are physically coupled to a gate of a sense transistor, wherein memory sections included in the first group of memory sections are associated with a first sense gate line that is distinct from other sense gate lines associated with other groups of memory sections.

According to an aspect of the device of one of the preceding five paragraphs, there is a device, wherein for an erase operation of a first memory cell in a first memory section: the first source line is to apply a low voltage to a source terminal of a first section select transistor of the first memory section; the first bitline is to apply a low voltage to a drain of a select gate of the first memory cell; the other source lines are to apply an inhibit voltage to the other source terminals of the other section select transistors of the other memory sections; a first sense gate line is to apply a high voltage to a gate of a first sense transistor of the first memory cell; the other sense gate lines are to apply a low voltage to gates of sense transistors of other memory cells; a first wordline is to apply a middle voltage to a gate of the first section select transistor and a gate of a first select transistor of the first memory cell; and the other wordlines are to apply a low voltage to a gate of the section select transistors and a gate of the select transistor of other memory cells, wherein the high voltage is higher than the low voltage, the middle voltage is within a range of voltages between the low voltage and the high voltage, and the inhibit voltage is within the range of voltages of the middle voltage.

According to an aspect of the device of one of the preceding six paragraphs, there is a device, wherein for a write operation of a first memory cell in a first memory section: a first source line is to apply a float voltage to a source terminal of a first section select transistor of the first memory section; other source lines are to apply a float voltage to source terminals of other section select transistors of other memory sections; a first sense gate line is to apply a low voltage to a gate of a first sense transistor of the first memory cell; other sense gate lines are to apply a low voltage, that is equal to or higher than the low voltage to apply to the first sense gate line, to gates of sense transistors of other memory cells; a first wordline is to apply a high voltage to a gate of the first section select transistor and a gate of a first select transistor of the first memory cell; other wordlines are to apply a low voltage to gates of section select transistors and gates of select transistors of other memory cells; a first bitline is to apply a middle voltage to a drain of the first select transistor; and other bitlines are to apply a float voltage to drains of other select transistors, wherein the high voltage is higher than the low voltage, the middle voltage is between the low voltage and the high voltage, and the float voltage is any voltage.

According to an aspect of the device of one of the preceding seven paragraphs, there is a device, wherein a first group of memory sections includes a plurality of memory sections in a same column of the memory device, and wherein the plurality of memory sections included in the first group of memory sections correspond to two or more rows of the memory device.

According to an aspect of the device of one of the preceding eight paragraphs, there is a device, wherein a first group of memory sections includes a plurality of memory sections corresponding to two or more columns of the memory device, and wherein the plurality of memory sections included in the first group of memory sections correspond to two or more rows of the memory device.

According to an aspect of the device of one of the preceding nine paragraphs, there is a device, wherein a memory section corresponds to a memory byte.

According to an aspect of the device of one of the preceding ten paragraphs, there is a device, wherein the plurality of memory cells in the memory section are selectable by a same wordline and a same sense gate line, and wherein each memory cell in the memory section is selectable by a different bitline.

According to an aspect of the device of one of the preceding eleven paragraphs, there is a device, wherein the memory device comprises an Electrically Erasable Programmable Read-Only Memory (EEPROM).

An aspect provides a system comprising: a memory device that includes: memory cells arranged in rows and columns, wherein respective ones of the memory cells have a select transistor and a sense transistor; memory sections, wherein respective ones of the memory sections includes a plurality of memory cells and a section select transistor; a source line physically coupled to a source terminal of a section select transistor; a bitline physically coupled to a drain of a select transistor; a wordline physically coupled to a gate of a section select transistor and a gate of a select transistor; and a sense gate line physically coupled to a gate of a sense transistor; and instructions stored in a machine-readable medium that, when executed, are configured to cause a processor to perform an erase operation on a first memory section in a first group of memory sections, the erase operation comprising: applying a low voltage to the source line; applying a low voltage to the bitline; applying a high voltage to the sense gate line; and applying a middle voltage to the wordline, wherein the high voltage is higher than the low voltage and the middle voltage is between the low voltage and the high voltage.

According to an aspect of the system of the preceding paragraph, there is a system, comprising: a bitline physically coupled to a drain of a select transistor; and instructions stored in a machine-readable medium that, when executed, are configured to cause a processor to perform a write operation on a first memory section in a first group of memory sections, the write operation comprising: applying a float voltage to the source line; applying a high voltage to the wordline; applying a low voltage to the sense gate line; and applying a middle voltage to the bitline, wherein the high voltage is higher than the low voltage, the middle voltage is between the low voltage and the high voltage, and the float voltage is any voltage.

According to an aspect of the system of one of the preceding two paragraphs, there is a system, wherein the first group of memory sections includes a plurality of memory sections in a same column of the memory device, and wherein the plurality of memory sections correspond to two or more rows of the memory device.

According to an aspect of the system of one of the preceding three paragraphs, there is a system, wherein the first group of memory sections includes a plurality of memory sections corresponding to two or more columns of the memory device, and wherein the plurality of memory sections included in the first group of memory sections correspond to two or more rows of the memory device.

BRIEF DESCRIPTION OF THE DRAWINGS

The figures illustrate examples of memory devices with architectures that function with less area and less voltage to provide longer endurance.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DESCRIPTION

An aspect provides a memory array architecture to lower the bitline voltage and decrease the lateral field, which may reduce charge trapping during cycling, so that the device may provide longer endurance.

According to aspects, memory array architectures are provided having one or more of the following characteristics: (1) a byte select transistor connected to source, wherein the bias may be greater than or equal to 0V; (2) a global sense gate with a negative bias for a write operation, and a global sense gate applied to 13.5V for an erase operation; (3) a bit-cell size (sense transistor and select transistor) may be relatively smaller if the bitline voltage (VBL) memory decreases with a negative voltage applied to the sense gate; (4) less stress resulting in more disturbance immunity; (5) endurance greater than one million cycles; and (6) an inhibit bias during erase within a middle voltage range.

An aspect provides a memory array architecture that operates with a lower bitline voltage to achieve a reduction in bit-cell size by reducing gate lengths and active space. An aspect may provide a high-density memory device with a reduced chip size.

An aspect provides a memory array architecture where the byte-selected transistor is connected to the source side, instead of the sense gate, to avoid the unselected bits from being biased with the inhibit voltage (>6V). This memory array architecture may provide less stress resulting in more disturbance immunity.

An aspect provides a memory array architecture with a global sense gate (SG) line that allows a negative voltage to be applied to the sense gate while simultaneously decreasing the bitline voltage.

An aspect provides a memory array architecture that operates with a high voltage of 12.5V at a select gate (wordline), a sense gate voltage (write) of −3.5V, and a bitline voltage (write) of 10V. A relatively smaller charge pump supplies voltage up to the high voltage of 13.5V. In particular, the positive charge pump may be smaller so that the extra space may be sufficient for a small negative charge pump. An aspect provides a memory array architecture that endures for greater than one million cycles.

Figure 1:
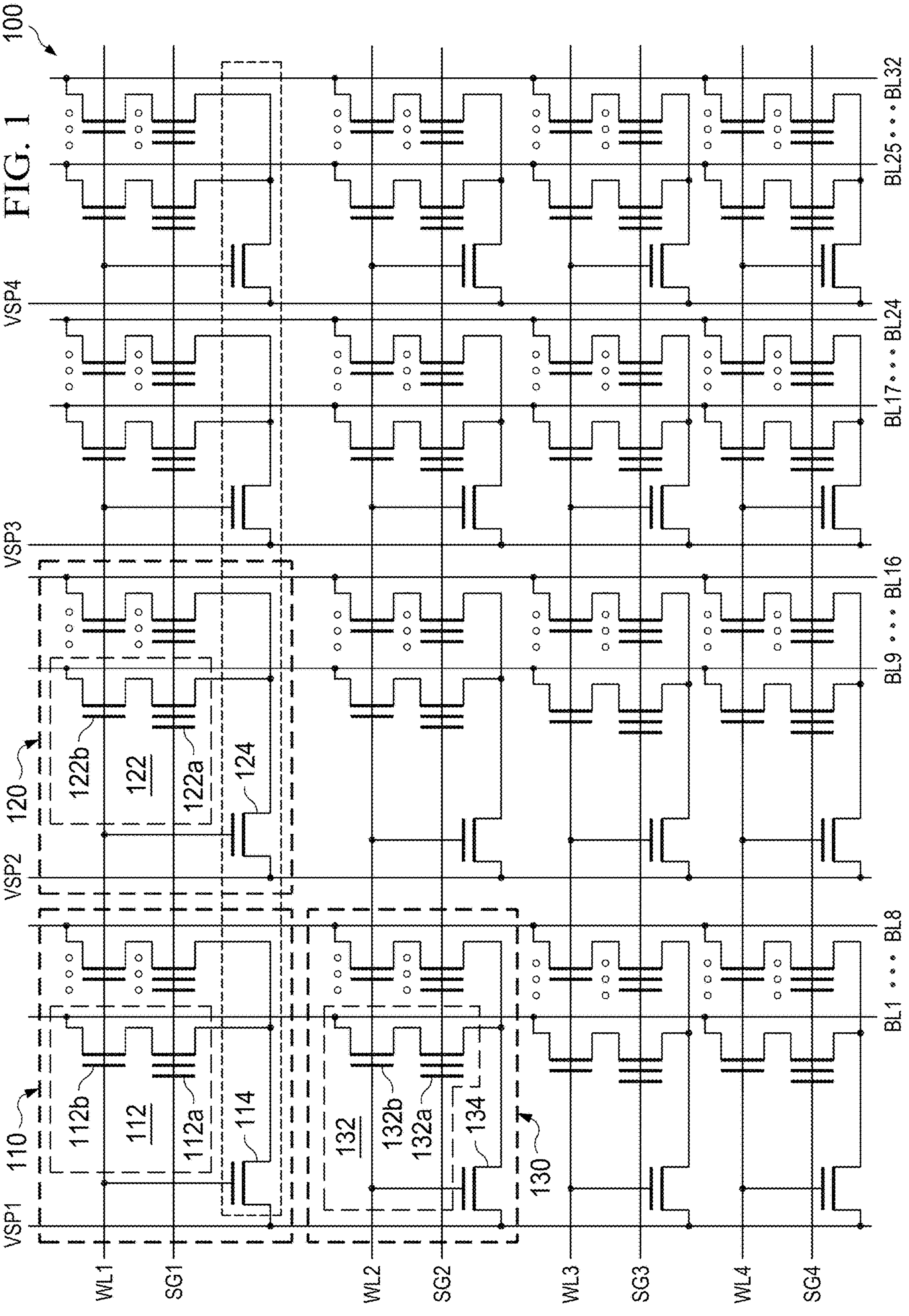
FIG. 1 shows a conceptual block diagram of a memory device that uses byte select transistors for selecting memory bytes.

FIG. 1 is a conceptual block diagram of a memory device 100 that uses byte select transistors for selecting memory bytes. The byte select transistor is connected to the source side instead of the sense gate.

The memory device 100 includes a number of memory cells, such as 112, 122, or 132. Each memory cell includes transistors such as sense transistor 112*a* and select transistor 112*b*. Memory cells are grouped into bytes, such as 110, 120 or 130. Each byte is associated with a byte select transistor, such as 114. The bytes of memory cells are arranged in rows and columns. Each row of memory bytes has a common wordline, for example, WL1, WL2, WL3 or WL4. Each column of memory corresponding to a byte, which is also called a byte column, is associated with a set of bitlines, for example, BL1-BL8, BL9-BL16, BL17-BL24 or BL25-BL32. In addition, each byte column is associated with a source line, such as VSP1, VSP2, VSP3 or VSP4.

In some implementations, each memory cell in memory device 100 includes a pair of transistors. For example, memory cell 132 includes sense transistor 132*a* and select transistor 132*b*. The select transistor 132*b* is configured for selecting the memory cell 132, while the sense transistor 132*a* is configured for storing a charge representing the value of the bit associated with memory cell 132.

The memory bytes in the memory device 100 are arranged in rows and columns. For example, bytes 110 and 120 are in the same row, while bytes 110 and 130 are in the same column of the memory device 100.

Each byte of memory includes a group of eight consecutive memory cells in one row of the memory device 100. For example, the byte 110 includes memory cell 112 and seven other memory cells, which are all present on the row associated with the wordline WL1. Although FIG. 1 shows each byte with two memory cells, it will be understood that each byte may include eight memory cells.

A wordline is coupled to all the memory cells in a byte, and to memory cells in all other bytes that are on the same row in the memory device 100. For example, wordline WL1 is coupled to the memory cells of byte 110, and also to the memory cells of byte 120.

Each byte column of the conventional memory device 100 includes a reference voltage line and eight bitlines. Each bitline is coupled to the corresponding vertically stacked memory cells in other bytes in the same column of the memory device. For example, source line VSP1 and the bitlines BL1 to BL8 are associated with the first byte column of the memory device 100 shown in FIG. 1, which includes bytes 110 and 130. The first bitline, BL1, is coupled to the first memory cell 112 in byte 110, and to the first memory cell 132 in the byte 130 that is vertically stacked below the first memory cell 112. Bitline BL8 is coupled to the eighth memory cell in each byte 110 and 130.

Each byte in the memory device 100 also includes a byte select transistor. For example, byte 110 includes byte select transistor 114, while byte 130 includes byte select transistor 134. The byte select transistor drain in each byte is connected to the sources of the sense transistors in the respective byte. For example, the drain of byte select transistor 114 is coupled to the sources of the eight sense transistors, including 112*a*, which correspond to the eight memory cells included in the byte 110.

For each row of the memory device 100, the associated wordline is also connected to the gate terminals of the byte select transistors and are common for a given wordline, the gate terminals being coupled to each other and to a wordline. For example, the gate terminals of the byte select transistor 114 in byte 110 and the byte select transistor 124 in byte 120 are coupled to WL1. The gate terminal of the byte select transistor 134 in byte 130 is coupled to WL2. The associated wordline is also connected to the gate terminals of the select transistors and are common for a given wordline, the gate terminals being coupled to each other and to a wordline. For example, the gate terminals of the select transistor 112*b* in byte 110 and the select transistor 122*b* in byte 120 are coupled to WL1. The gate terminal of the select transistor 132*b* in byte 130 is coupled to WL2.

In the memory device 100, the gate terminals of the sense transistors are common for a given sense gate line, the gate terminals being coupled to each other and to the corresponding sense gate line. For example, the gate terminals of the sense transistor 112*a* in byte 110 and the sense transistor 122*a* in byte 120 are coupled to SG1. The gate terminal of the sense transistor 132*a* in byte 130 is coupled to SG2.

For each column of the memory device 100, the associated source line is coupled to the source terminals of the byte select transistors included in the bytes associated with the column. For example, in the first column, the source line VSP1 is connected to the source terminals of byte select transistors 114 and 134. In the second column, the source line VSP2 is connected to the source terminal of byte select transistor 124.

Figure 2A:
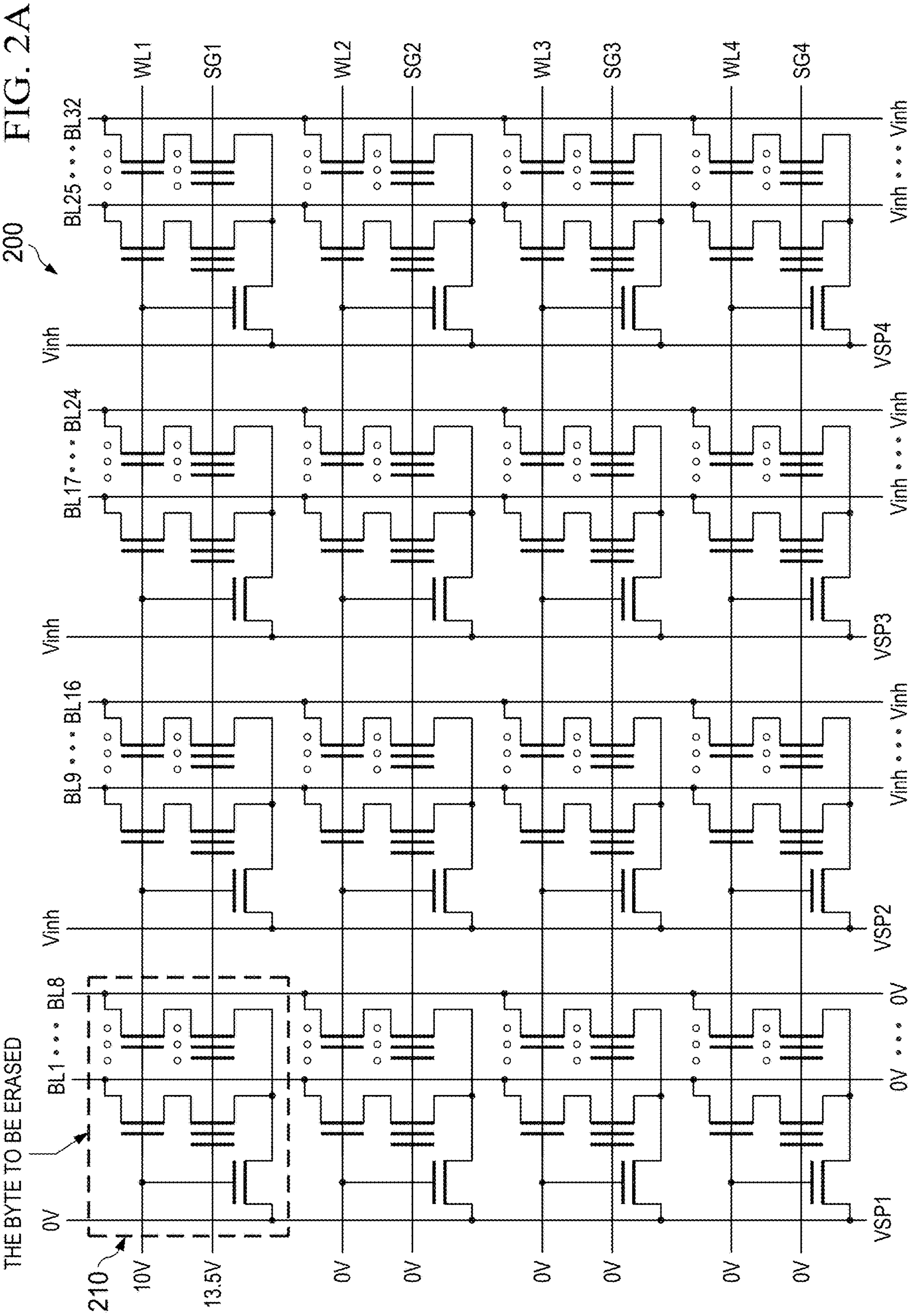
FIG. 2A shows a conceptual block diagram of a memory device, wherein a byte is selected to be erased.

FIG. 2A is a conceptual block diagram of a memory device 200, wherein a byte is selected to be erased. A middle voltage (MV) can be set to a range of values as an inhibit bias to eliminate the influence on unselected bits in the same row as a high voltage (HV) on a sense gate line (SG). For purposes of this disclosure, the term "inhibit voltage" (Vinh) is defined as a voltage within an appropriate range to reduce the electric field for memory cells and prevents the erase/write mechanism from occurring on the unselected bits. Typically, it falls between the MV range specified above.

In the example illustrated in FIG. 2A, the byte 210 to be erased is the first byte in the first row (top to bottom) and the first column (left to right) of the array. 13.5V is applied on the first sense gate SG1 while 0V is applied on the second, third, and fourth sense gates SG2, SG3, and SG4. The select gate voltage on a wordline (WL) can be reduced from 16V to 10V as it passes a middle voltage (<10V) to the unselected bits. In the illustrated example, 10V is applied on the first wordline WL1, while 0V is applied on the second, third, and fourth wordlines WL2, WL3, and WL4. Source selection via a source line (VSP) prevents the middle voltage from having influence on the unselected bits that do not belong to the selected row. In the illustrated example, 0V is applied on the first source line VSP1 and bitlines one through eight BL1-BL8, while the inhibit voltage (Vinh) is applied on the second, third, and fourth source lines VSP2, VSP3, and VSP4 and the bitlines nine through thirty-two BL9-BL32.

Figure 2B:
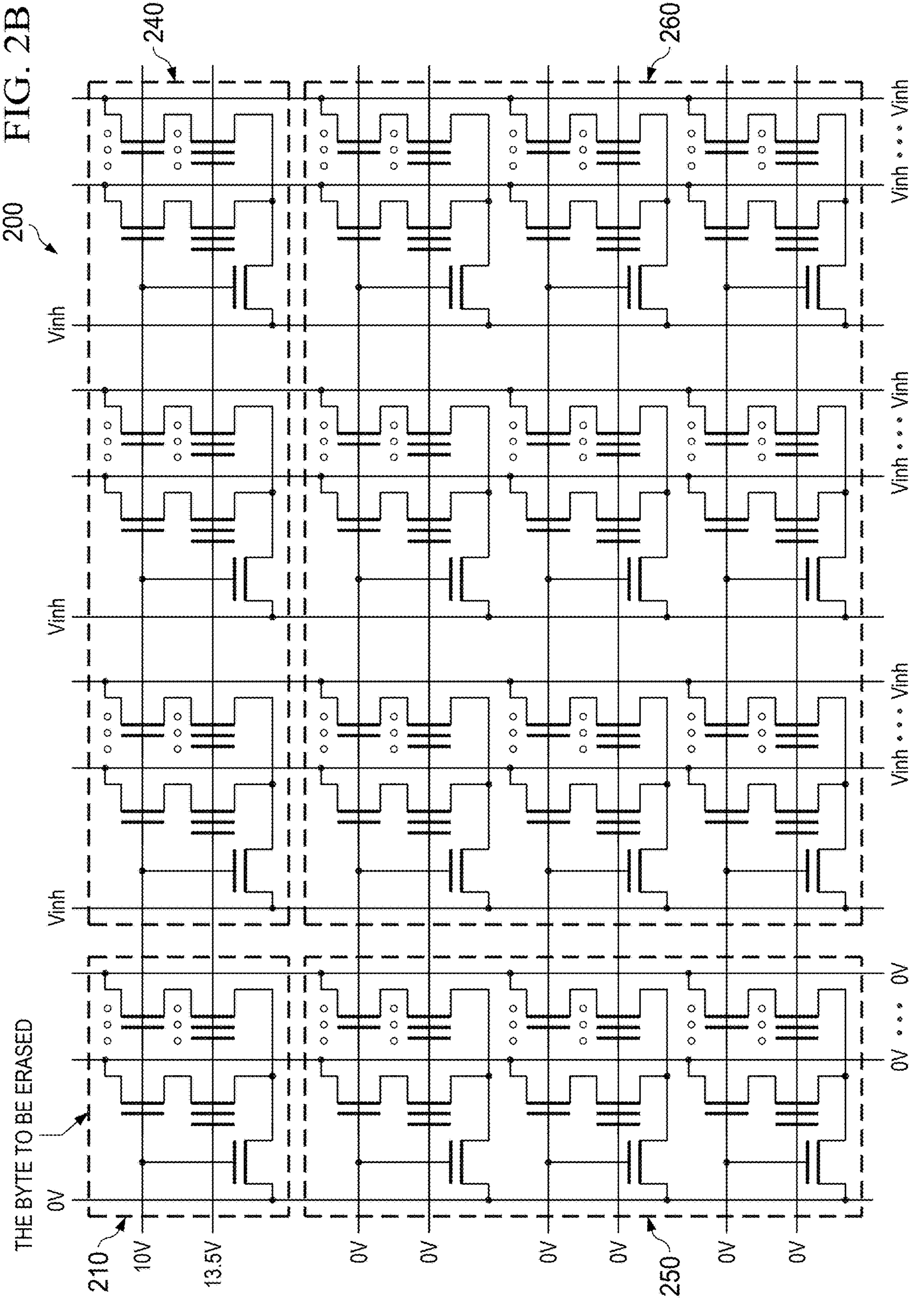
FIG. 2B shows a conceptual block diagram of the memory device of FIG. 2A, wherein the selected and nonselected bytes are identified.

FIG. 2B is a conceptual block diagram of the memory device 200 of FIG. 2A, wherein the selected and nonselected bytes are identified. The byte 210 to be erased is the first byte in the first row (top to bottom) and the first column (left to right) of the array. Unselected bytes 240 are the remaining bytes in the first row. Unselected bytes 250 are the remaining bytes in the first column. Unselected bytes 260 are the remaining bytes in the remainder of the array.

Figure 2C:
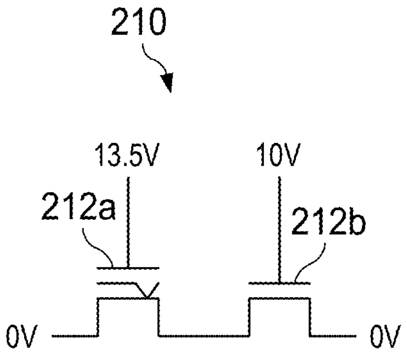
FIG. 2C shows a conceptual block diagram of a memory cell of the selected byte of FIG. 2B including a select transistor and a sense transistor of the byte to be erased.

FIG. 2C is a conceptual block diagram of a memory cell of the selected byte 210 of FIG. 2B including a sense transistor 212*a* and a select transistor 212*b* of byte 210 to be erased. 10V is applied to the gate of the select transistor 212*b* and 13.5V is applied to the gate of the sense transistor 212*a*. 0V are applied to the source of the sense transistor 212*a* and to the drain of the select transistor 212*b*.

Figure 2D:
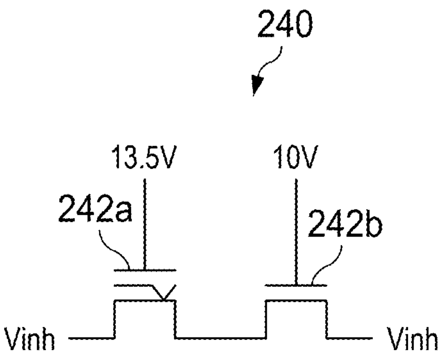
FIG. 2D shows a conceptual block diagram of a memory cell of the unselected bytes of the first row of bytes of FIG. 2B including a select transistor and a sense transistor, wherein the cell is not selected to be erased.

FIG. 2D is a conceptual block diagram of a memory cell of the unselected bytes 240 of the first row of bytes of FIG. 2B including a sense transistor 242*a* and a select transistor 242*b*, wherein the cell is not selected to be erased. 10V is applied to the gate of the select transistor 242*b* and 13.5V is applied to the gate of the sense transistor 242*a*. The inhibit voltage is applied to the source of the sense transistor 242*a* and to the drain of the select transistor 242*b*.

Figure 2E:
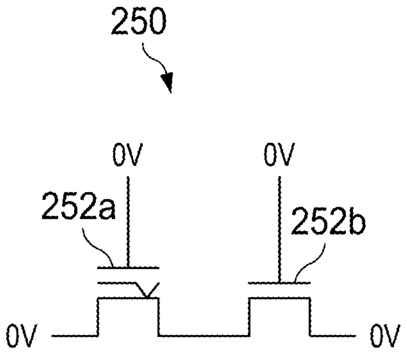
FIG. 2E shows a conceptual block diagram of a memory cell of the unselected bytes of the first column of bytes of FIG. 2B including a select transistor and a sense transistor, wherein the cell is not selected to be erased.

FIG. 2E is a conceptual block diagram of a memory cell of the unselected bytes 250 of the first column of bytes of FIG. 2B including a sense transistor 252*a* and a select transistor 252*b*, wherein the cell is not selected to be erased. 0V is applied to the gate of the select transistor 252*b* and 0V is applied to the gate of the sense transistor 252*a*. 0V is applied to the source of the sense transistor 252*a* and to the drain of the select transistor 252*b*.

Figure 2F:
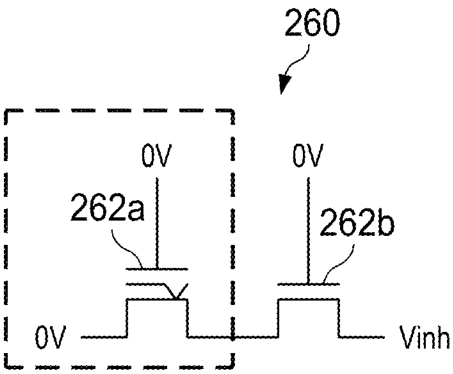
FIG. 2F shows a conceptual block diagram of a memory cell of the unselected bytes of the remaining bytes of FIG. 2B including a select transistor and a sense transistor, wherein the memory cell is not selected to be erased.

FIG. 2F is a conceptual block diagram of a memory cell of the unselected bytes 160 of the remaining bytes of FIG. 2B including a sense transistor 262*a* and a select transistor 262*b*, wherein the memory cell is not selected to be erased. 0V is applied to the gate of the select transistor 262*b* and 0V is applied to the gate of the sense transistor 262*a*. 0V is applied to the source of the sense transistor 262*a* and the inhibit voltage is applied to the drain of the select transistor 262*b*.

Figure 3A:
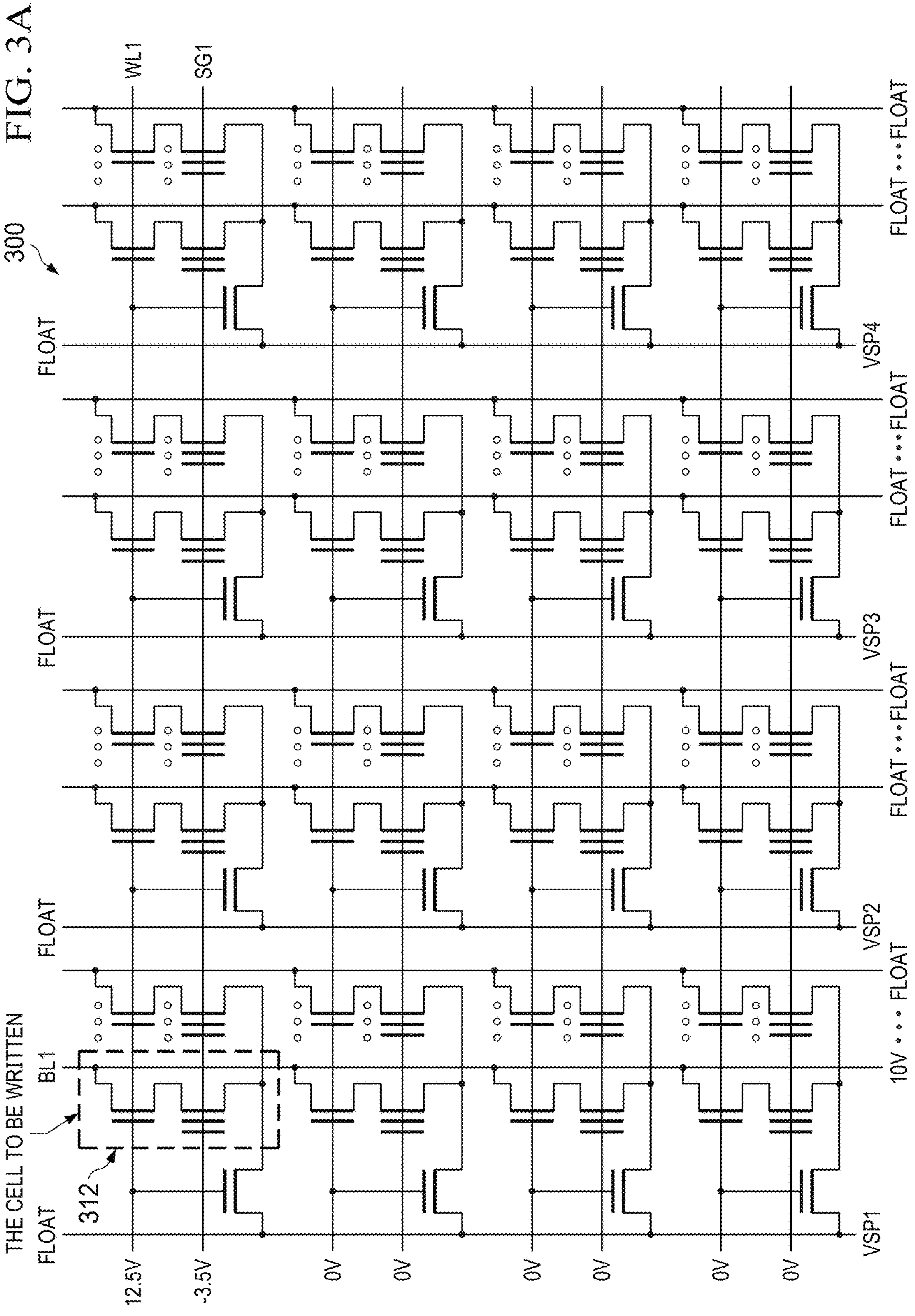
FIG. 3A shows a conceptual block diagram of the memory device, wherein a memory cell for a bit is selected to be written.

FIG. 3A is a conceptual block diagram of the memory device 300, wherein a memory cell 312 for a bit is selected to be written. In this example, the first memory cell 312 in the first row and the first column is selected to be written. 10V is applied to the first bitline BL1 and a float voltage is applied to the remaining bitlines. A float voltage is applied to the source line VSP1-VSP4. 12.5V is applied to the first wordline WL1, and −3.5V is applied to the first sense gate line SG1. 0V is applied to the remaining wordlines and sense gate lines.

Figure 3B:
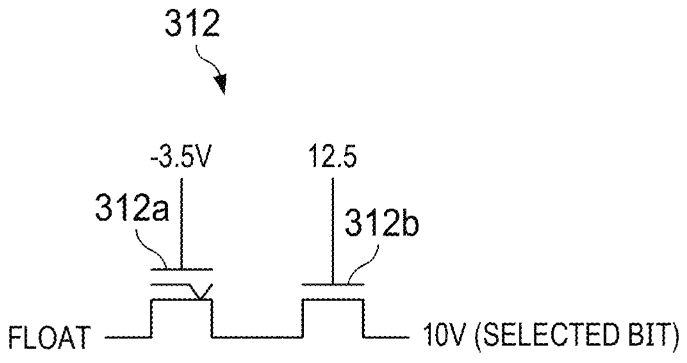
FIG. 3B shows a conceptual block diagram of the memory cell of a bit selected to be written of FIG. 3A including a select transistor and a sense transistor, wherein the memory cell is selected to be written.

FIG. 3B is a conceptual block diagram of the memory cell 312 of a bit selected to be written of FIG. 3A including a sense transistor 312*a* and a select transistor 312*b*, wherein the memory cell 312 is selected to be written. 12.5V is applied to the gate of the select transistor 312*b* and −3.5V is applied to the gate of the sense transistor 312*a*. Float Voltage is applied to the source of the sense transistor 312*a* and 10V is applied to the drain of the select transistor 312*b*.

Figure 4:
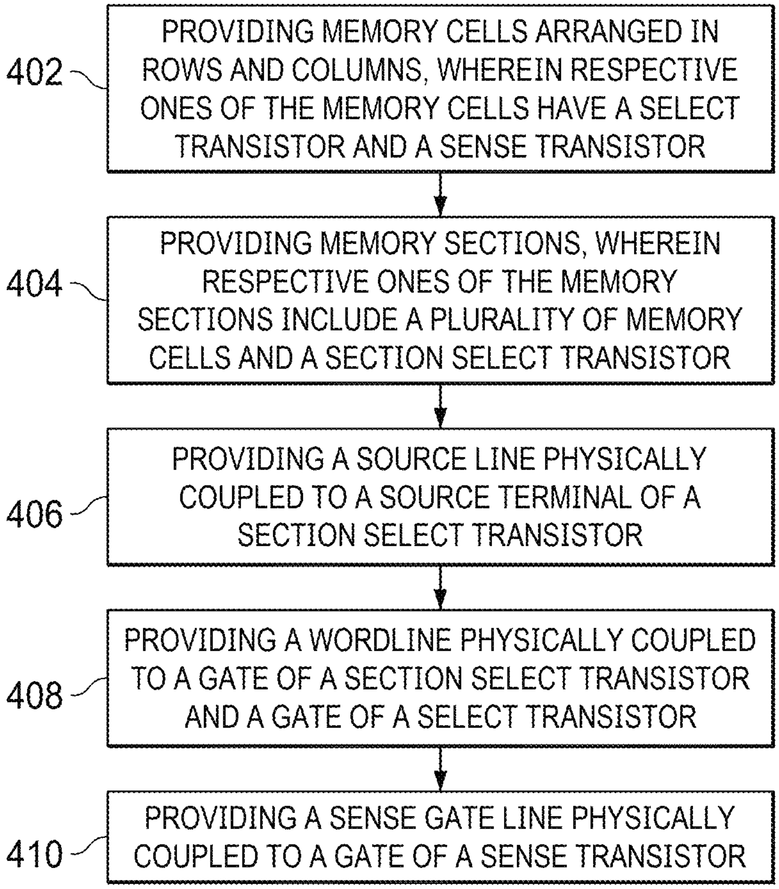
FIG. 4 shows a flow chart of a method.

FIG. 4 shows a flow chart of a method. Memory cells are provided 402 arranged in rows and columns, wherein respective ones of the memory cells have a select transistor and a sense transistor. Memory sections are provided 404, wherein respective ones of the memory sections include a plurality of memory cells and a section select transistor. A source line is provided 406 physically coupled to a source terminal of a section select transistor. A wordline is provided 408 physically coupled to a gate of a section select transistor and a gate of a select transistor. A sense gate line is provided 410 physically coupled to a gate of a sense transistor.

Although examples have been described above, other variations and examples may be made from this disclosure without departing from the spirit and scope of these disclosed examples.

The invention claimed is:

1. A method comprising:

providing memory cells arranged in rows and columns, wherein respective ones of the memory cells have a select transistor and a sense transistor;

providing memory sections, wherein respective ones of the memory sections includes a plurality of memory cells and a section select transistor;

providing a source line physically coupled to a source terminal of a section select transistor;

providing a wordline physically coupled to a gate of a section select transistor and a gate of a select transistor; and providing a sense gate line physically coupled to a gate of a sense transistor.

2. The method of claim 1, comprising erasing a memory cell of a memory section comprising:

applying a low voltage to the source line;

providing a bitline physically coupled to a drain of a select transistor and applying a low voltage to the bitline;

applying a high voltage to the sense gate line; and applying an middle voltage to the wordline, wherein the high voltage is higher than the low voltage and the middle voltage is between the low voltage and the high voltage.

3. The method of claim 1, comprising:

providing a bitline physically coupled to a drain of a select transistor.

4. The method of claim 3, comprising writing a memory cell of a memory section comprising:

applying a float voltage to the source line;

applying a high voltage to the wordline;

applying a low voltage to the sense gate line; and applying an middle voltage to the bitline, wherein the high voltage is higher than the low voltage, the middle voltage is between the low voltage and the high voltage, and the float voltage is any voltage.

5. A device comprising:

memory cells arranged in rows and columns, wherein respective ones of the memory cells have a select transistor and a sense transistor;

memory sections, wherein respective ones of the memory sections includes a plurality of memory cells and a section select transistor;

a source line physically coupled to a source terminal of a section select transistor;

a wordline physically coupled to a gate of a section select transistor and a gate of a select transistor; and a sense gate line physically coupled to a gate of a sense transistor.

6. The device of claim 5, comprising respective ones of bitlines physically coupled to respective ones of drains of respective ones of select transistors, wherein for an erase operation of a first memory cell in a first memory section:

a first source line is to apply a low voltage to a source terminal of a first section select transistor of the first memory section;

a first bitline is to apply a low voltage to a drain of a first select gate transistor of the first memory cell;

a first sense gate line is to apply a high voltage to a gate of a first sense transistor of the first memory cell; and a first wordline is to apply an middle voltage to a gate of the first section select transistor and a gate of a first select transistor of the first memory cell, wherein the high voltage is higher than the low voltage and the middle voltage is between the low voltage and the high voltage.

7. The device of claim 5, comprising:

a bitline physically coupled to a drain of a select transistor.

8. The device of claim 7, wherein for a write operation of a first memory cell in a first memory section:

a first source line is to apply a float voltage to a source terminal of a first section select transistor of the first memory section;

a first sense gate line is to apply a low voltage to a gate of a first sense transistor of the first memory cell;

a first wordline is to apply a high voltage to a gate of the first section select transistor and a gate of a first select transistor of the first memory cell; and a first bitline is to apply a middle voltage to a drain of the first select transistor, wherein the high voltage is higher than the low voltage, the middle voltage is between the low voltage and the high voltage, and the float voltage is any voltage.

9. The device of claim 5, comprising:

bitlines associated with groups of memory cells, respectively, wherein respective ones of the bitlines are physically coupled to respective ones of select transistors at drain terminals, wherein a first memory cell is associated with a first bitline that is distinct from other bitlines associated with other memory cells;

source lines associated with groups of memory sections, respectively, wherein respective ones of the source lines are physically coupled to respective ones of section select transistors at source terminals, wherein memory sections included in a first group of memory sections are associated with a first source line that is distinct from other source lines associated with other groups of memory sections;

wordlines associated with groups of memory sections, respectively, wherein respective ones of the wordlines are physically coupled to a gate of a section select transistor and a gate of a select transistor, wherein memory sections included in the first group of memory sections are associated with a first wordline that is distinct from other wordlines associated with other groups of memory sections; and sense gate lines associated with groups of memory sections, respectively, wherein respective ones of the sense gate lines are physically coupled to a gate of a sense transistor, wherein memory sections included in the first group of memory sections are associated with a first sense gate line that is distinct from other sense gate lines associated with other groups of memory sections.

10. The device of claim 9, wherein for an erase operation of a first memory cell in a first memory section:

the first source line is to apply a low voltage to a source terminal of a first section select transistor of the first memory section;

the first bitline is to apply a low voltage to a drain of a select gate of the first memory cell;

the other source lines are to apply an inhibit voltage to the other source terminals of the other section select transistors of the other memory sections;

a first sense gate line is to apply a high voltage to a gate of a first sense transistor of the first memory cell;

the other sense gate lines are to apply a low voltage to gates of sense transistors of other memory cells;

a first wordline is to apply a middle voltage to a gate of the first section select transistor and a gate of a first select transistor of the first memory cell; and the other wordlines are to apply a low voltage to a gate of the section select transistors and a gate of the select transistor of other memory cells, wherein the high voltage is higher than the low voltage, the middle voltage is within a range of voltages between the low voltage and the high voltage, and the inhibit voltage is within the range of voltages of the middle voltage.

11. The device of claim 9, wherein for a write operation of a first memory cell in a first memory section:

a first source line is to apply a float voltage to a source terminal of a first section select transistor of the first memory section;

other source lines are to apply a float voltage to source terminals of other section select transistors of other memory sections;

a first sense gate line is to apply a low voltage to a gate of a first sense transistor of the first memory cell;

other sense gate lines are to apply a low voltage, that is equal to or higher than the low voltage to apply to the first sense gate line, to gates of sense transistors of other memory cells;

a first wordline is to apply a high voltage to a gate of the first section select transistor and a gate of a first select transistor of the first memory cell;

other wordlines are to apply a low voltage to gates of section select transistors and gates of select transistors of other memory cells;

a first bitline is to apply a middle voltage to a drain of the first select transistor; and other bitlines are to apply a float voltage to drains of other select transistors, wherein the high voltage is higher than the low voltage, the middle voltage is between the low voltage and the high voltage, and the float voltage is any voltage.

12. The device of claim 5, wherein a first group of memory sections includes a plurality of memory sections in a same column of the memory device, and wherein the plurality of memory sections included in the first group of memory sections correspond to two or more rows of the memory device.

13. The device of claim 5, wherein a first group of memory sections includes a plurality of memory sections corresponding to two or more columns of the memory device, and wherein the plurality of memory sections included in the first group of memory sections correspond to two or more rows of the memory device.

14. The device of claim 5, wherein a memory section corresponds to a memory byte.

15. The device of claim 5, wherein the plurality of memory cells in the memory section are selectable by a same wordline and a same sense gate line, and wherein each memory cell in the memory section is selectable by a different bitline.

16. The device of claim 5, wherein the memory device comprises an Electrically Erasable Programmable Read-Only Memory (EEPROM).

17. A system comprising:

a memory device that includes:

memory cells arranged in rows and columns, wherein respective ones of the memory cells have a select transistor and a sense transistor;

memory sections, wherein respective ones of the memory sections includes a plurality of memory cells and a section select transistor;

a source line physically coupled to a source terminal of a section select transistor;

a bitline physically coupled to a drain of a select transistor;

a wordline physically coupled to a gate of a section select transistor and a gate of a select transistor; and a sense gate line physically coupled to a gate of a sense transistor; and instructions stored in a machine-readable medium that, when executed, are configured to cause a processor to perform an erase operation on a first memory section in a first group of memory sections, the erase operation comprising:

applying a low voltage to the source line;

applying a low voltage to the bitline;

applying a high voltage to the sense gate line; and applying a middle voltage to the wordline, wherein the high voltage is higher than the low voltage and the middle voltage is between the low voltage and the high voltage.

18. The system of claim 17, comprising:

a bitline physically coupled to a drain of a select transistor; and instructions stored in a machine-readable medium that, when executed, are configured to cause a processor to perform a write operation on a first memory section in a first group of memory sections, the write operation comprising:

applying a float voltage to the source line;

applying a high voltage to the wordline;

applying a low voltage to the sense gate line; and applying a middle voltage to the bitline, wherein the high voltage is higher than the low voltage, the middle voltage is between the low voltage and the high voltage, and the float voltage is any voltage.

19. The system of claim 17, wherein the first group of memory sections includes a plurality of memory sections in a same column of the memory device, and wherein the plurality of memory sections correspond to two or more rows of the memory device.

20. The system of claim 17, wherein the first group of memory sections includes a plurality of memory sections corresponding to two or more columns of the memory device, and wherein the plurality of memory sections included in the first group of memory sections correspond to two or more rows of the memory device.

* * * * *